(12) United States Patent
Gomez et al.

(10) Patent No.: US 6,522,554 B1
(45) Date of Patent: Feb. 18, 2003

(54) CIRCUIT CARD RAIL POSITIONING SYSTEM

(75) Inventors: Michael E. Gomez, Garland, TX (US); Ronnie L. Watkins, Allen, TX (US); Denise L. Smart, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/829,025

(22) Filed: Apr. 9, 2001

Related U.S. Application Data

(63) Continuation-in-part of application No. 09/750,213, filed on Dec. 28, 2000.

(51) Int. Cl.[7] ................................................ H05K 5/00
(52) U.S. Cl. ...................... 361/756; 361/802; 361/727; 361/741; 439/377
(58) Field of Search ................................. 361/756, 760, 361/752, 748, 741, 727, 730, 686, 807, 809, 825, 797, 802; 174/35 R, 51; 257/99; 439/377

(56) References Cited

U.S. PATENT DOCUMENTS 4,164,362 A * 8/1979 Cobaugh et al. ............ 361/802
5,057,968 A * 10/1991 Morrison ................ 165/104.33
6,309,237 B1 * 10/2001 Longueville ................ 439/267

FOREIGN PATENT DOCUMENTS

EP          2157895 A  * 10/1985  ............ H05K/7/14

* cited by examiner

Primary Examiner—David Martin
Assistant Examiner—Hung Bui
(74) Attorney, Agent, or Firm—Campbell Stephenson Ascolese LLP

(57) ABSTRACT

A railing system for printed circuit boards, an apparatus and method advantageously allow modular arrangements of printed circuit boards (PCBs) in a shelf and maximize space in a shelf by providing rails on the PCBs that are slidably connectable with card guides in the shelf. The railing system includes a PCB having two sides, at least one of the sides with electronic components disposed thereon, and at least one rail secured to the PCB, the rail being perpendicular to the sides of the PCB, wherein the rail permits insertion of the PCB into a shelf outfitted with one or more guides for securing the rail and the PCB within the shelf by suspension from the rail and independent of further support. The rail in combination with the one or more card guides provide a crude alignment for mating the electrical components on the PCB with connectors disposed in the shelf. Further, the rail in combination with the one or more card guides conserve space within the shelf by permitting contiguous PCB installation within the shelf.

27 Claims, 5 Drawing Sheets

US 6,522,554 B1

CIRCUIT CARD RAIL POSITIONING SYSTEM

CROSS-REFERENCE TO RELATED APPLICATIONS

This application is a continuation-in-part of copending U.S. application Ser. No. 09/750,213, filed Dec. 28, 2000, entitled "Electronic System Fire Containment and Suppression", naming Felipe D. Mendoza, Michael E. Gomez, and Sheldon L. Rohde as inventors.

BACKGROUND OF THE INVENTION

1. Field of the Invention

The present invention relates to the field of shelving systems for circuit cards, and more particularly, to shelving systems of communications networks components.

2. Description of the Related Art

A data communications network allows communication between multiple communicating entities over one or more data communications links. High bandwidth applications supported by these networks include streaming video, streaming audio, and large aggregations of voice traffic. In the future, these demands are certain to increase. To meet such demands, an increasingly popular alternative is the use of lightwave communications carried over fiber optic cables. The use of lightwave communications provides several benefits, including high bandwidth, ease of installation, and capacity for future growth.

The synchronous optical network (SONET) protocol is among those protocols designed to employ an optical infrastructure and is widely employed in voice and data communications networks. SONET is a physical transmission vehicle capable of transmission speeds in the multi-gigabit range, and is defined by a set of electrical as well as optical standards. A similar standard to SONET is the Synchronous Digital Hierarchy (SDH) which is the optical fiber standard predominantly used in Europe. There are only minor differences between the two standards. Accordingly, hereinafter any reference to the term SONET refers to both SDH and SONET networks, unless otherwise noted.

Referring to FIG. 1, a typical SONET network requires a shelf 100 for printed circuit boards holding interfaces. A printed circuit board (PCB), such as PCB 120 required for network communication includes optical connections as well as hard-wired connections. A network shelf must accommodate different sizes of PCBs in each vertical column. A problem with the typical shelf system is that smaller PCBs with optical connectors are often damaged upon installation. Further, electrical connectors typically suffer from pin stubbing and bending during installation into a typical shelf. Another problem associated with the typical shelf system is that combining different size PCBs in a single vertical column is difficult for most shelf systems and impossible for other shelf systems. Thus, the typical shelf does not efficiently use available space. One known method of permitting different sized PCBs in a single vertical shelf is to provide removable card guides that change the size of the modules before PCBs are installed. Thus, a physical change to the shelf system is required each time a reconfiguration of PCBs is desired.

What is needed is a shelf system that accommodates reconfigurations without requiring a physical redesign of the shelf and further protects electrical and optical components from damage.

SUMMARY OF THE INVENTION

In accordance with the present invention, a railing system for printed circuit boards, an apparatus and method advantageously allow modular arrangements of printed circuit boards (PCBs) in a shelf and simultaneously maximizes space in the shelf by providing rails on the PCBs that are slidably connectable with card guides in the shelf. More particularly, the railing system includes a PCB having two sides, at least one of the sides with electronic components disposed thereon, and at least one rail secured to the PCB, the rail being perpendicular to the sides of the PCB, wherein the rail permits insertion of the PCB into a shelf outfitted with one or more guides for securing the rail and the PCB within the shelf by suspension from the rail and independent of further support. The rail in combination with the one or more card guides provide a crude alignment for mating the electrical components on the PCB with connectors disposed in the shelf. Further, the rail in combination with the one or more card guides conserve space within the shelf by permitting contiguous PCB installation within the shelf. In one embodiment, the railing system provides that the PCB has two sides and the at least one rail includes two rails, one on each side of the PCB. In an alternate embodiment, the railing system provides that each side of the PCB is coupled to two rails, the rails being secured to the PCB with screws. The railing system further provides that the size of the PCB is variable, the one or more guides accommodating the variability. More specifically, the one or more guides include a plurality card guides disposed within the shelf, each card guide being a distance X from a next card guide, wherein a plurality of PCBs having a variety of sizes with the at least one rail are insertable into the card guides at multiples of X. For example, in one embodiment the size of the PCB varies from a 2.490 inch size, a 5.002 inch size, a 10.036 inch size and a 20.104 inch size. Further, the railing system allows both electrical and optical components disposed on the PCB to be configured for a synchronous optical network (SONET) communication system.

One embodiment is directed to an apparatus including at least one rail designed to be secured to a printed circuit board (PCB) at two points on the PCB, the PCB having two sides, at least one of the sides with electronic components disposed thereon, the rail being installable perpendicular to the sides of the PCB, wherein the rail permits insertion of the PCB into a shelf outfitted with one or more guides for securing the rail and the PCB within the shelf by suspension from the rail. In one embodiment, the rail includes a first rail and a second rail, the first rail including two threaded areas for accepting two screws for securing the first rail to the PCB, and the second rail including two areas defining holes for inserting the two screws and threading the two screws into the first rail and the second rail. In another embodiment, each threaded area mates with an area defining a hole on the PCB and to one of the two areas defining holes on the second rail thereby allowing a screw to be inserted into the hole on the second rail, through the PCB and to be screwed into the threaded area. In another embodiment each PCB has two sets, each set including the first rail and the second rail, the first set attached to an upper portion of the PCB and the second set attached to a lower portion of the PCB. The first rail and the second rail of each set are U-shaped, the first rail of each set extending outward from the PCB farther than the second rail of each set. Each rail is a U-shaped stainless steel with a 6 gauge thickness. In one embodiment, the rail is one of four rails disposed on the PCB, and the PCB is one of a plurality of sizes.

Another embodiment of the invention is directed to an apparatus including a shelf for receiving at least one printed circuit board (PCB), the PCB being coupled to at least one rail; and at least one card guide disposed on an interior side wall of the shelf, the at least one card guide permitting insertion of the PCB into the shelf and securing the rail and the PCB within the shelf by suspension from the rail in the card guide.

Another embodiment is directed to a method for a railing system for printed circuit boards. The method includes providing a shelf for receiving at least one printed circuit board (PCB), the PCB being coupled to at least one rail, and providing at least one card guide disposed on an interior side wall of the shelf, the at least one card guide permitting insertion of the PCB into the shelf and securing the rail and the PCB within the shelf by suspension from the rail in the card guide.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
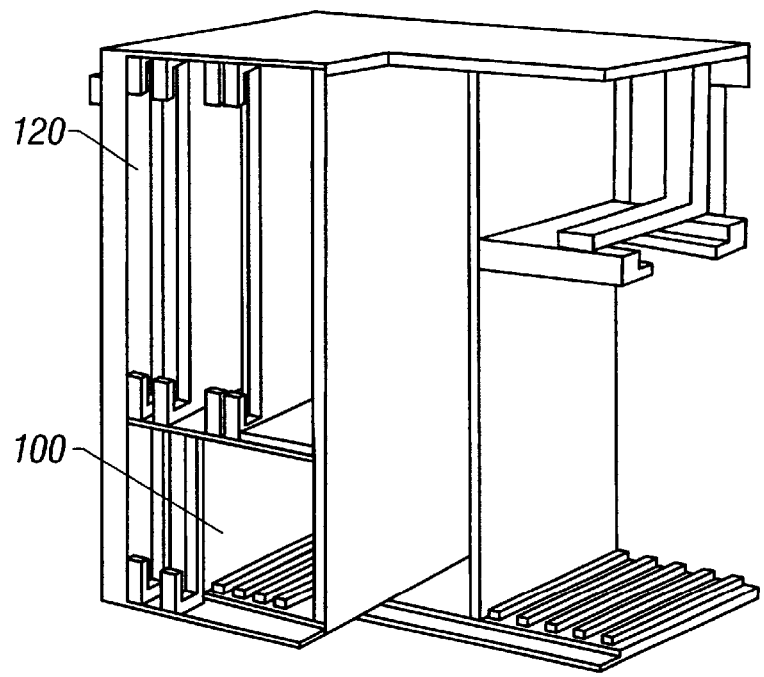
FIG. 1, labeled "prior art" shows a typical shelf for holding printed circuit boards (PCBs).
Figure 2:
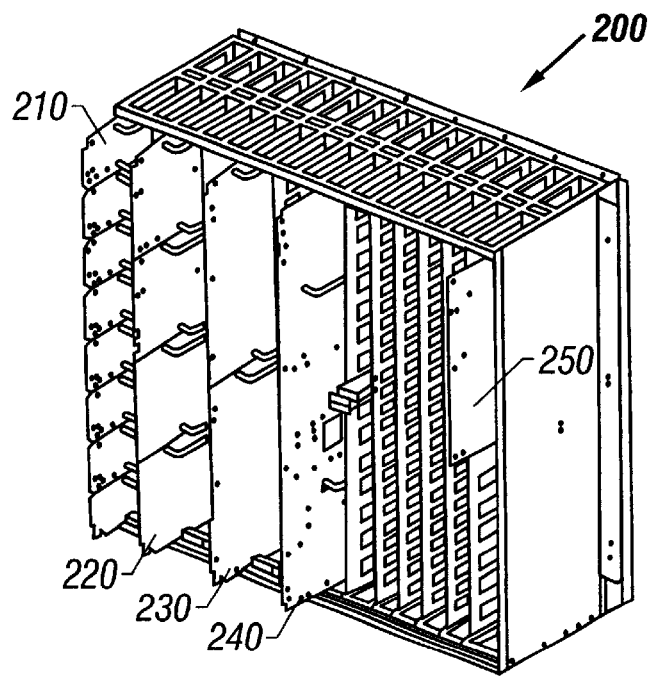
FIG. 2 shows a shelf system with a plurality of printed circuit boards (PCBs) in accordance with an embodiment of the present invention.
Figure 3:
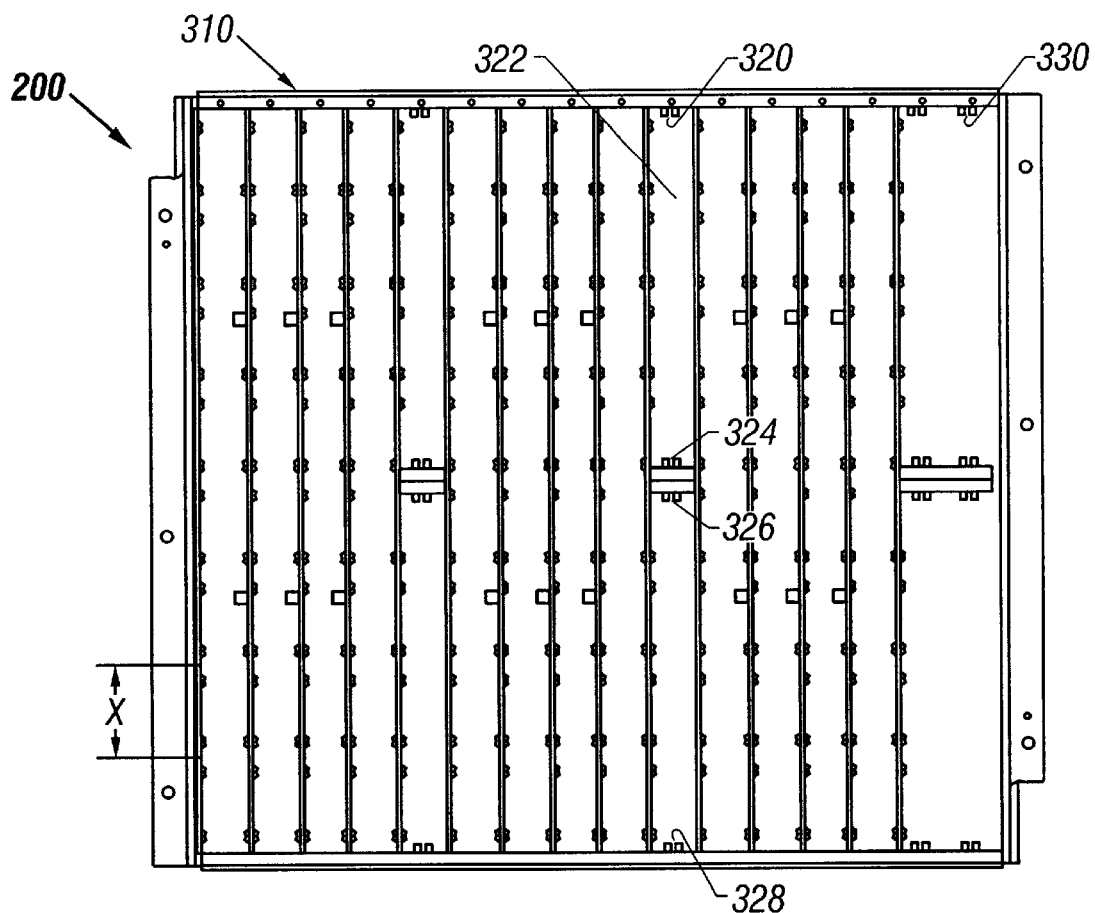
FIG. 3 shows a shelf system showing a plurality of card guides according to an embodiment of the present invention.

Referring to FIG. 2, a shelf system 200 is shown according to an embodiment of the present invention. According to an embodiment, the shelf system 200 accommodates at least one printed circuit board (PCB), such as PCB 210, 220, 230 or 240. Each of PCB 210, 220, 230 and 240 is shown being inserted into the shelf system 200. An embodiment of the invention includes the shelf system 200 with card guides disposed on an interior side wall of the shelf. Referring to FIG. 3, shelf system 200 is shown with a plurality of card guides disposed on interior side walls. Referring to FIGS. 2 and 3 in combination, the shelf system 200 enables a plurality of PCBs of variant sizes to be inserted into the card guides. More particularly, an embodiment of the invention provides that the card guides are included in the shelf on interior side walls with a predetermined distance between them. Thus, PCBs with rails that are the predetermined distance apart and PCBs that have rails that are multiples of the predetermined distance can be inserted into the shelf system 200. As shown in FIG. 3, the card guides are configured to receive multiple PCBs of the PCB 210 size.

The card guides are also configured to receive PCBs of larger sizes when the PCBs have rails that are located at distances that are multiples of smaller PCB 210 size. For example, each vertical column configured according to an embodiment of the present invention shown in FIG. 2 and FIG. 3, holds either eight PCBs 210, four PCBs 220, two PCBs 230 or one PCB 240. Thus, the order in which the PCBs are shown in FIG. 2 is changeable due to the plurality of card guides, as shown in FIG. 3.

FIG. 3 additionally shows vertically aligned card guides 320 and 330. These card guides optionally are included in the shelf system 200 to hold prior art PCBs that are held by top and bottom card guides. As shown, the prior art method of providing multiple PCB's in one vertical column requires additional top and bottom guides such as guides 320, 324, 326 and 328. Although shelf system 200 is shown with prior art guides that are disposed to secure a PCB from the top and bottom, the prior art method is inefficient because of the area lost in adding the additional card guides. The typical area lost can be approximated by calculating the height required for additional card guides as 0.40 inches, multiplied by the typical depth of the shelf of 11 inches, multiplied by two for double-sided PCBs. Thus, approximately 4.5 inches squared per board side of area is lost when a shelf uses the prior art method of top and bottom card guides.

Figure 4:
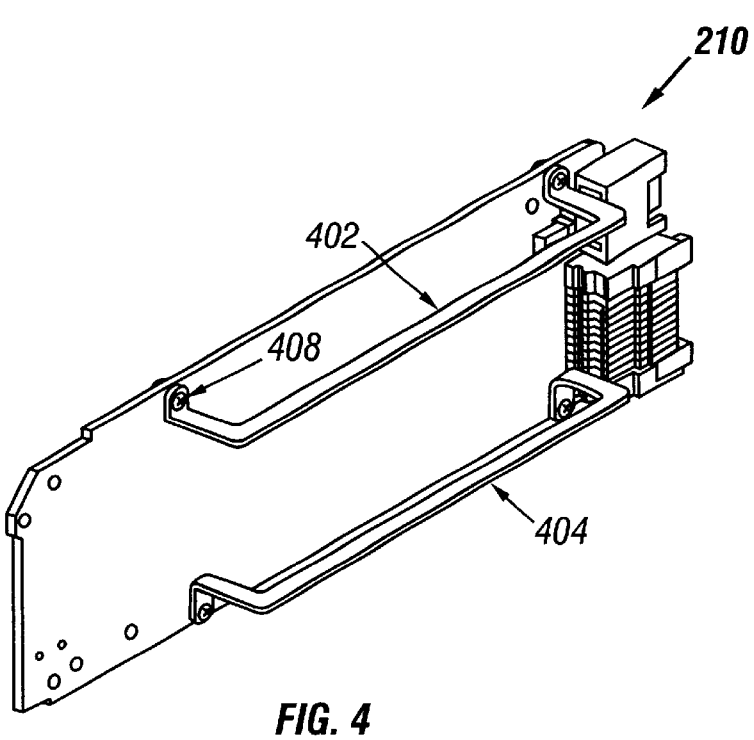
FIG. 4 shows a front side of a PCB with rails in accordance with an embodiment of the present invention.
Figure 5:
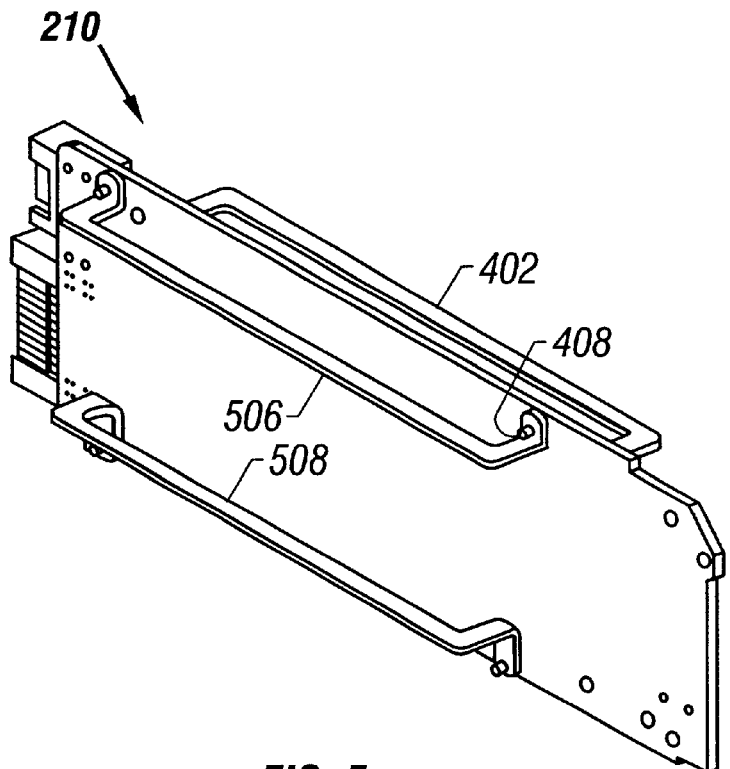
FIG. 5 shows a backside of a PCB with rails in accordance with an embodiment of the present invention.

Referring now to FIG. 4 and FIG. 5, PCB 210 is shown in further detail. As shown, PCB 210, in one embodiment, includes rails 402, 404, 506 and 508. For stability purposes, each PCB 210, 220, 230 and 240 optionally includes four rails, although one of skill in the art appreciates that the number of rails may change according to system design requirements. Additionally, each rail on one side of the PCB 210, according to an embodiment, includes clearance holes for accepting screws, and each rail on the opposing side of the PCB 210 is threaded to accept the screws. More particularly, referring to FIG. 4, PCB 210 is shown with rail 402. Rail 402 is shown fastened to PCB 210 with screw 408. FIG. 4 shows the head portion of screw 408. FIG. 5 shows the opposing side of PCB 210 and the end portion of screw 408. Rail 506, in one embodiment, includes an area defining a threaded hole for receiving screw 408 and, thereby, securing the rails 402 and 506 to the PCB 210.

Figure 6:
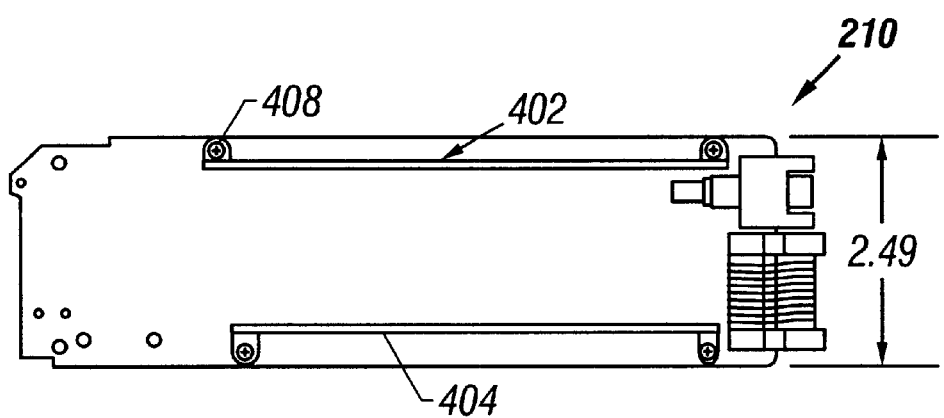
FIG. 6 shows a height dimension of a 1.5U PCB in accordance with an embodiment of the present invention.
Figure 7:
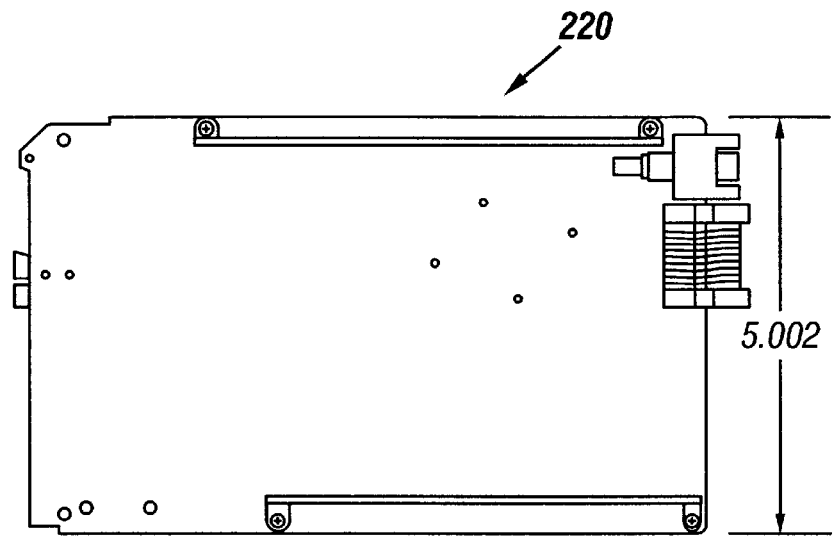
FIG. 7 shows a height dimension of a 3U PCB in accordance with an embodiment of the present invention.
Figure 8:
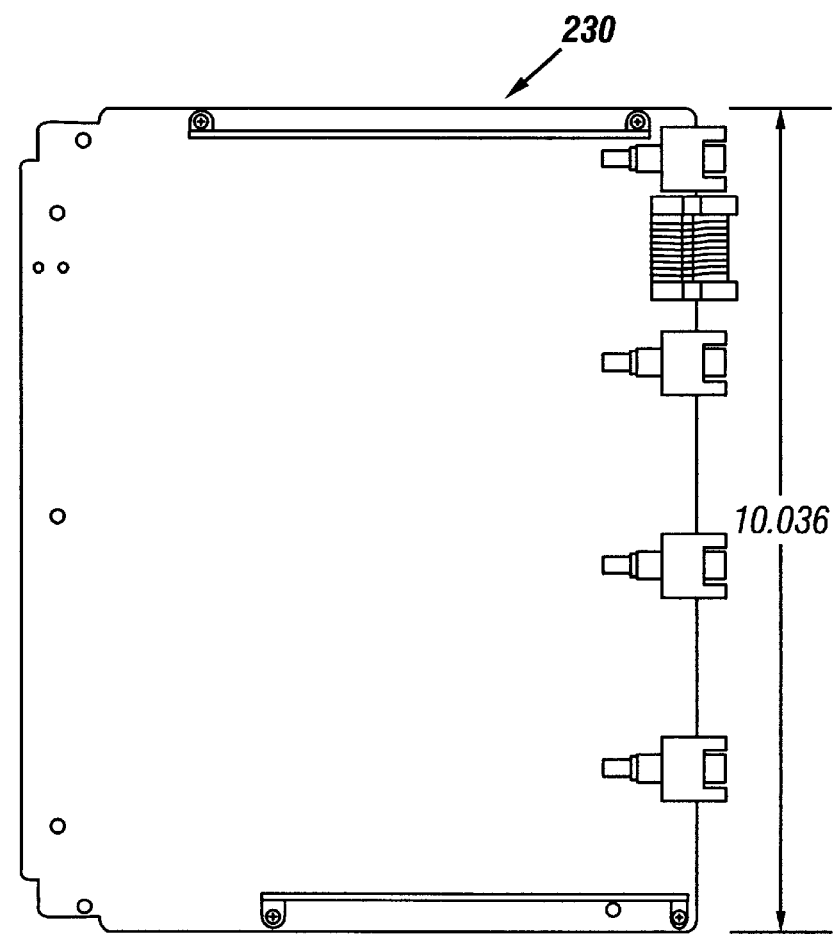
FIG. 8 shows a height dimension of a 6U PCB in accordance with an embodiment of the present invention.
Figure 9:
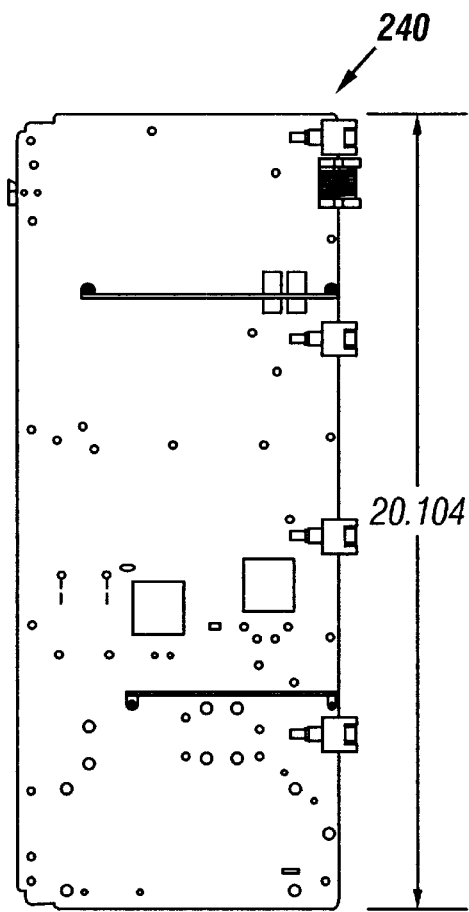
FIG. 9 shows a height dimension of a 12U PCB in accordance with an embodiment of the present invention.

As is known by those of skill in the art, the height of electronic enclosures is generally referred to by the number of units, commonly referred to as "U"s that fit in the enclosure. A standard U is 1.75 inches in height. In one embodiment, a U is smaller. Referring now to FIG. 6, another view of PCB 210 is shown. FIG. 6 shows the height dimension of PCB 210 in inches. As shown, in an embodiment, PCB 210 is 2.49 inches tall and represents a 1.5 U size PCB, or 0.135 smaller than a standard 2.625 inch 1.5 U PCB. Likewise, referring to FIG. 7, a PCB 220 is shown as representing a 3U PCB with a height of 5.002 inches. Referring to FIG. 8, a PCB 230 is shown as representing a 6U PCB with a height of 10.036 inches. Referring to FIG. 9, a PCB 240 is shown as representing a 12U PCB with a height of 20.104 inches. As can be appreciated by those of skill in the art, the embodiments of the present invention are equally applicable to standard size U PCBs and custom sized PCBs.

Referring back to FIG. 2, an embodiment of the present invention relates to stacking a variety of different sized PCB's s in the shelf system 200. Thus, in a single vertical shelf, as shown, either eight PCB 210, four PCB 220, two PCB 230 or one PCB 240 can fit into each vertical shelf, or any conforming combination. In one embodiment, twelve vertical columns are provided in the shelf system for customer expansion. Thus, a customer can choose a configuration of all 1.5 U PCBs, thus having a total of 96 PCB's in the shelf. Alternatively, a shelf system may be filled with 48 3 U PCBs, 24 6 U PCB, or twelve 12 U PCBs. Further, any combination that adds up to 12U in a single vertical column in the shelf may be used. For example, a 6 U PCB and two 3 U PCBs could be used in a vertical column; or a 6U PCB and four 1.5U PCBs could be used in a vertical column.

Figure 10:
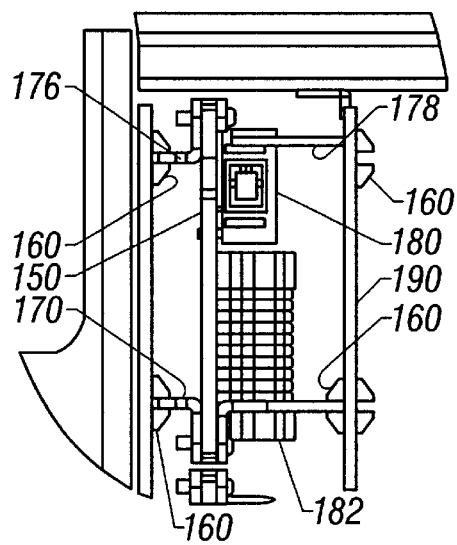
FIG. 10 shows a front view of a PCB installed into card guides in accordance with an embodiment of the present invention.

Referring now to FIG. 10, a front view of a PCB 150 installed into a shelf with card guides in accordance with an embodiment of the present invention is shown. More particularly, FIG. 10 shows PCB 150 disposed within a shelf configured with a plurality of card guides 160. As shown, the PCB 150 is held in place with the plurality of card guides 160, and is held in place by suspending the PCB 150 from the rails 170 independent from top of bottom guides. As shown in FIG. 10, serve to guide the PCB 150 into a mating backplane. Further, as demonstrated in FIG. 10, the card guides 160 in combination with rails 170 provide for sufficient airflow around components 180 and 182. By suspending the PCB 150 in the shelf space, the present invention advantageously provides more airflow around the PCB 150 than the typical shelf system.

Still referring to FIG. 10, an embodiment of the present invention provides for leaving spaces where one of the card guides would otherwise be located. Thus, instead of a card guide, the space may be taken by components on the PCB. In one embodiment, the rail that would otherwise fit into a card guide does not install into a card guide, but provides stability to the PCB in the shelf by allowing the rail to lean against the side wall of the shelf. Referring to FIG. 10, rail 178 is shown against side wall 190 without a card guide 160. Additionally, rail 178 is shown as displaced horizontally relative to rail 176. In this embodiment, optical components requiring additional space on the side with rail 178 require displacing the rail. Thus, the location of the rail 178 is variable depending on design requirements of the PCB.

Other Embodiments

Although particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A railing system for printed circuit boards, the system comprising:
   a printed circuit board (PCB) having two sides, at least one of the sides with electronic components disposed thereon;
   at least one rail secured to the PCB, the rail being perpendicular to the sides of the PCB, wherein the at least one rail permits insertion of the PCB into a shelf outfitted with one or more guides for securing the at least one rail and the PCB within the shelf by suspension from the at least one rail and independent of further support;
   wherein the one or more guides include a plurality of card guides disposed within the shelf, each card guide being a distance X from a next card guide, wherein a plurality of PCBs having a variety of sizes with the at least one rail are insertable into the card guides at multiples of X; and
   wherein the size of the PCB is variable, the one or more guides accommodating the variability by being a distance X from each other and spanning a height of the shelf.

2. The railing system of claim 1 wherein the at least one rail in combination with the one or more card guides provide a crude alignment for mating the electrical components on the PCB with connectors disposed in the shelf.

3. The railing system of claim 1 wherein the at least one rail in combination with the one or more card guides permit vertically contiguous PCB installation within the shelf.

4. The railing system of claim 1 wherein the PCB has two sides and the at least one rail includes two rails, one on each side of the PCB.

5. The railing system of claim 1, further comprising:
   a first rail and a second rail, the first rail and the second rail attached to a first side of the PCB; and
   a third rail and a fourth rail, the third rail and the fourth rail attached to a second side of the PCB, wherein the second side is a side opposite the first side.

6. The railing system of claim 1 wherein the size of the PCB varies from a 2.490 inch size, a 5.002 inch size, a 10.036 inch size and a 20.104 inch size.

7. The railing system of claim 1 wherein the railing system allows both electrical and optical components disposed on the PCB to be configured for a synchronous optical network (SONET) communication system.

8. An apparatus comprising:
   at least one rail designed to be secured to a printed circuit board (PCB) at two points on the PCB, the PCB having two sides, at least one of the sides with electronic components disposed thereon, the at least one rail being perpendicular to the sides of the PCB, wherein the at least one rail permits insertion of the PCB into a shelf outfitted with one or more guides for securing the at least one rail and the PCB within the shelf by suspension from at least one the rail; and
   wherein the at least one rail includes a first rail and a second rail, the first rail including two through-holes for receiving two screws to secure threaded areas for accepting two screws for securing the first rail to a first side of the PCB, and the second rail including two through-holes for receiving the two screws to secure the second rail to a second side of the PCB, the second side opposite the first side.

9. The apparatus of claim 8 wherein:
   the PCB includes two through holes; and
   each through-hole of the first rail mates with each through-hole in the PCB and to each through-hole on the second rail thereby allowing a screw to be inserted into each through-hole on the second rail, through each through-hole in the PCB and to be screwed into each through hole of the first rail.

10. The apparatus of claim 9 wherein each PCB includes a first set of rails and a second set of rails, each of the first set of rails and the second set of rails including the first rail and the second rail, wherein the first set of rails is attached to an upper portion of the PCB and the second set of rails is attached to a lower portion of the PCB.

11. The apparatus of claim 10 wherein the first rail and the second rail are U-shaped, the first rail extending outward from the PCB farther than the second rail.

12. An apparatus comprising:
   a shelf for receiving at least one printed circuit board (PCB), the PCB being coupled to at least one rail;
   at least one card guide disposed on an interior side wall of the shelf, the at least one card guide permitting insertion of the PCB into the shelf and securing the rail and the PCB within the shelf by suspension from the rail in the card guide; and wherein:
the at least one rail includes two rails, one on each side of the PCB, and
the at least one card guide includes two card guides disposed on interior side walls of the shelf.

13. The apparatus of claim 12 wherein a plurality of interior side walls of the shelf each include a distribution of a plurality of the at least one card guide, the distribution permitting a variety of sizes and number of PCBs to be installed within the shelf independent of altering the shelf.

14. The apparatus of claim 13 wherein the variety of sizes of PCBs includes a 2.490 inch size, a 5.002 inch size, a 10.036 inch size and a 20.104 inch size.

15. The apparatus of claim 12 wherein the at least one rail in combination with the at least one card guide provide a crude alignment for mating the electrical components on the PCB with connectors disposed in the shelf.

16. The apparatus of claim 12 wherein the at least one rail in combination with the at least one card guide conserve space within the shelf by permitting contiguous PCB installation within the shelf.

17. The apparatus of claim 12 wherein the shelf allows both electrical and optical components disposed on the PCB to be configured for a synchronous optical network (SONET) communication system.

18. A method for a railing system for printed circuit boards, the method comprising:
providing a shelf for receiving at least one printed circuit board (PCB), the PCB being coupled to at least one rail;
providing at least one card guide disposed on an interior side wall of the shelf, the at least one card guide permitting insertion of the PCB into the shelf and securing the rail and the PCB within the shelf by suspension from the rail in the card guide; and
wherein the at least one card guide include a plurality card guides disposed within the shelf, each card guide being a distance X from a next card guide, wherein a plurality of PCBs having a variety of sizes with the at least one rail are insertable into the card guides at multiples of X.

19. The method of claim 18 wherein the rail in combination with the at least one card guide provide a crude alignment for mating electrical components disposed on the PCB with connectors disposed in the shelf.

20. The method of claim 18 wherein the rail in combination with the at least one card guide permit vertically contiguous installation of the PCB within the shelf.

21. The method of claim 18 wherein the size of the PCB varies from a 2.490 inch size, a 5.002 inch size, a 10.036 inch size and a 20.104 inch size.

22. The method of claim 18 wherein the shelf allows both electrical and optical components disposed on the PCB to be configured for a synchronous optical network (SONET) communication system.

23. An apparatus comprising:
at least one rail designed to be secured to a printed circuit board (PCB) at two points on the PCB, the PCB having two sides, at least one of the sides with electronic components disposed thereon, the rail being perpendicular to the sides of the PCB, wherein the rail permits insertion of the PCB into a shelf outfitted with one or more guides for securing the rail and the PCB,
wherein the rail is part of a railing system including four rails for securing the PCB in the shelf, wherein two rails are disposed one each side of the PCB.

24. The apparatus of claim 23 wherein the four rails in combination with the one or more card guides provide a crude alignment for mating the electrical components on the PCB with connectors disposed in the shelf.

25. The apparatus of claim 23 wherein the rail is a U-shaped stainless steel with a 16 gauge thickness.

26. The apparatus of claim 23 wherein the PCB is one of a plurality of sizes.

27. The apparatus of claim 23 wherein the plurality of sizes includes a 2.490 inch size, a 5.002 inch size, a 10.036 inch size and a 20.104 inch size.

* * * * *